United States Patent
Wehrly, Jr. et al.

(10) Patent No.: US 7,443,023 B2
(45) Date of Patent: *Oct. 28, 2008

(54) HIGH CAPACITY THIN MODULE SYSTEM

(75) Inventors: James Douglas Wehrly, Jr., Austin, TX (US); James Wilder, Austin, TX (US); Paul Goodwin, Austin, TX (US); Mark Wolfe, Round Rock, TX (US)

(73) Assignee: Entorian Technologies, LP, Austin, TX (US)

( * ) Notice: Subject to any disclaimer, the term of this patent is extended or adjusted under 35 U.S.C. 154(b) by 302 days.

This patent is subject to a terminal disclaimer.

(21) Appl. No.: 11/231,418

(22) Filed: Sep. 21, 2005

(65) Prior Publication Data

US 2006/0091529 A1    May 4, 2006

Related U.S. Application Data

(63) Continuation-in-part of application No. PCT/US2005/028547, filed on Aug. 10, 2005, and a continuation-in-part of application No. 11/068,688, filed on Mar. 1, 2005, now Pat. No. 7,324,352, which is a continuation-in-part of application No. 11/007,551, filed on Dec. 8, 2004, which is a continuation-in-part of application No. 10/934,027, filed on Sep. 3, 2004, application No. 11/231,418, and a continuation-in-part of application No. 11/005,992, filed on Dec. 7, 2004, which is a continuation-in-part of application No. 10/934,027, filed on Sep. 3, 2004, application No. 11/231,418, and a continuation-in-part of application No. 11/193,954, filed on Jul. 29, 2005, which is a continuation-in-part of application No. 11/007,551, filed on Dec. 8, 2004, application No. 11/231,418, and a continuation-in-part of application No. 11/123,721, filed on May 6, 2005, which is a continuation-in-part of application No. 11/068,688, filed on Mar. 1, 2005, now Pat. No. 7,324,352, and a continuation-in-part of application No. 11/005,992, filed on Dec. 7, 2004, and a continuation-in-part of application No. 10/934,027, filed on Sep. 3, 2004.

(51) Int. Cl.
  H01L 23/34    (2006.01)
  H01L 21/00    (2006.01)
  H05K 7/20     (2006.01)

(52) U.S. Cl. .................. 257/707; 257/713; 257/717; 257/720; 257/730; 361/704; 361/709; 361/718; 361/749; 438/122

(58) Field of Classification Search .............. None
  See application file for complete search history.

(56) References Cited

U.S. PATENT DOCUMENTS 3,372,310 A    3/1968    Kantor (Continued)

FOREIGN PATENT DOCUMENTS

EP    122-687 A    10/1984

(Continued)

OTHER PUBLICATIONS

U.S. Appl. No. 11/306,803, filed Jan. 11, 2006, Chris Karabatsos.

(Continued)

*Primary Examiner*—Alonzo Chambliss
(74) *Attorney, Agent, or Firm*—Fish & Richardson P.C.

(57) ABSTRACT

Flexible circuitry is populated with integrated circuitry disposed along one or both of its major sides. Contacts distributed along the flexible circuitry provide connection between the module and an application environment. The circuit-populated flexible circuitry is disposed about an edge of a rigid substrate thus placing the integrated circuitry on one or both sides of the substrate with one or two layers of integrated circuitry on one or both sides of the substrate. The substrate form is preferably devised from thermally conductive materials and includes a high thermal conductivity core or area that is disposed proximal to higher thermal energy devices such as an AMB when the flex circuit is brought about the substrate. Other variations include thermally-conductive clips that grasp respective ICs on opposite sides of the module to further shunt heat from the ICs. Preferred extensions from the substrate body or substrate core encourage reduced thermal variations amongst the integrated circuits of the module.

13 Claims, 13 Drawing Sheets

U.S. PATENT DOCUMENTS

| | | |
|---|---|---|
| 3,436,604 A | 4/1969 | Hyltin |
| 3,582,865 A | 6/1971 | Franck et al. |
| 3,654,394 A | 4/1972 | Gordon |
| 3,704,455 A | 11/1972 | Scarbrough |
| 3,718,842 A | 2/1973 | Abott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,025,992 A * | 2/2000 | Dodge et al. ............... 361/704 |
| 6,028,352 A | 2/2000 | Eide |
| 6,028,365 A | 2/2000 | Akram et al. |

| | | | |
|---|---|---|---|
| 6,034,878 A | 3/2000 | Osaka et al. | |
| 6,038,132 A | 3/2000 | Tokunaga et al. | |
| 6,040,624 A | 3/2000 | Chambers et al. | |
| 6,049,975 A | 4/2000 | Clayton | |
| 6,060,339 A | 5/2000 | Akram et al. | |
| 6,072,233 A | 6/2000 | Corisis et al. | |
| 6,078,515 A | 6/2000 | Nielsen et al. | |
| 6,084,294 A | 7/2000 | Tomita | |
| 6,091,145 A | 7/2000 | Clayton | |
| 6,097,087 A | 8/2000 | Farnworth et al. | |
| 6,111,757 A | 8/2000 | Dell et al. | |
| 6,121,676 A | 9/2000 | Solberg | |
| RE36,916 E | 10/2000 | Moshayedi | |
| 6,157,541 A | 12/2000 | Hacke | |
| 6,172,874 B1 | 1/2001 | Bartilson | |
| 6,178,093 B1 | 1/2001 | Bhatt et al. | |
| 6,180,881 B1 | 1/2001 | Isaak | |
| 6,187,652 B1 | 2/2001 | Chou et al. | |
| 6,205,654 B1 | 3/2001 | Burns | |
| 6,208,521 B1 | 3/2001 | Nakatsuka | |
| 6,208,546 B1 | 3/2001 | Ikeda | |
| 6,214,641 B1 | 4/2001 | Akram | |
| 6,215,181 B1 | 4/2001 | Akram et al. | |
| 6,215,687 B1 | 4/2001 | Sugano et al. | |
| 6,222,737 B1 | 4/2001 | Ross | |
| 6,222,739 B1 | 4/2001 | Bhakta et al. | |
| 6,225,688 B1 | 5/2001 | Kim et al. | |
| 6,232,659 B1 * | 5/2001 | Clayton | 257/724 |
| 6,233,650 B1 | 5/2001 | Johnson et al. | |
| 6,234,820 B1 | 5/2001 | Perino et al. | |
| 6,262,476 B1 | 7/2001 | Vidal | |
| 6,262,895 B1 | 7/2001 | Forthun | |
| 6,265,660 B1 | 7/2001 | Tandy | |
| 6,266,252 B1 | 7/2001 | Karabatsos | |
| 6,281,577 B1 | 8/2001 | Oppermann et al. | |
| 6,288,907 B1 | 9/2001 | Burns | |
| 6,288,924 B1 | 9/2001 | Sugano et al. | |
| 6,300,679 B1 | 10/2001 | Mukerji et al. | |
| 6,316,825 B1 | 11/2001 | Park et al. | |
| 6,323,060 B1 | 11/2001 | Isaak | |
| 6,336,262 B1 | 1/2002 | Dalal et al. | |
| 6,343,020 B1 | 1/2002 | Lin et al. | |
| 6,347,394 B1 | 2/2002 | Ochoa et al. | |
| 6,349,050 B1 | 2/2002 | Woo et al. | |
| 6,351,029 B1 | 2/2002 | Isaak | |
| 6,357,023 B1 | 3/2002 | Co et al. | |
| 6,358,772 B2 | 3/2002 | Miyoshi | |
| 6,360,433 B1 | 3/2002 | Ross | |
| 6,368,896 B2 | 4/2002 | Farnworth et al. | |
| 6,370,668 B1 | 4/2002 | Garrett, Jr. et al. | |
| 6,376,769 B1 | 4/2002 | Chung | |
| 6,392,162 B1 | 5/2002 | Karabatsos | |
| 6,404,043 B1 | 6/2002 | Isaak | |
| 6,410,857 B1 | 6/2002 | Gonya | |
| 6,426,240 B2 | 7/2002 | Isaak | |
| 6,426,549 B1 | 7/2002 | Isaak | |
| 6,426,560 B1 | 7/2002 | Kawamura et al. | |
| 6,428,360 B2 | 8/2002 | Hassanzadeh et al. | |
| 6,433,418 B1 | 8/2002 | Fujisawa et al. | |
| 6,444,921 B1 | 9/2002 | Wang et al. | |
| 6,446,158 B1 | 9/2002 | Karabatsos | |
| 6,449,159 B1 | 9/2002 | Haba | |
| 6,452,826 B1 | 9/2002 | Kim et al. | |
| 6,459,152 B1 | 10/2002 | Tomita et al. | |
| 6,462,412 B2 | 10/2002 | Kamei et al. | |
| 6,465,877 B1 | 10/2002 | Farnworth et al. | |
| 6,465,893 B1 | 10/2002 | Khandros et al. | |
| 6,472,735 B2 | 10/2002 | Isaak | |
| 6,473,308 B2 | 10/2002 | Forthun | |
| 6,486,544 B1 | 11/2002 | Hashimoto | |
| 6,489,687 B1 | 12/2002 | Hashimoto | |
| 6,502,161 B1 | 12/2002 | Perego et al. | |
| 6,514,793 B2 | 2/2003 | Isaak | |
| 6,521,984 B2 | 2/2003 | Matsuura | |
| 6,528,870 B2 | 3/2003 | Fukatsu et al. | |
| 6,531,772 B2 | 3/2003 | Akram et al. | |
| 6,544,815 B2 | 4/2003 | Isaak | |
| 6,552,910 B1 | 4/2003 | Moon et al. | |
| 6,552,948 B2 | 4/2003 | Woo et al. | |
| 6,560,117 B2 | 5/2003 | Moon | |
| 6,566,746 B2 | 5/2003 | Isaak et al. | |
| 6,572,387 B2 | 6/2003 | Burns et al. | |
| 6,573,593 B1 | 6/2003 | Syri et al. | |
| 6,576,992 B1 | 6/2003 | Cady et al. | |
| 6,588,095 B2 | 7/2003 | Pan | |
| 6,590,282 B1 | 7/2003 | Wang et al. | |
| 6,600,222 B1 | 7/2003 | Levardo | |
| 6,614,664 B2 | 9/2003 | Lee | |
| 6,627,984 B2 | 9/2003 | Bruce et al. | |
| 6,629,855 B1 | 10/2003 | North et al. | |
| 6,646,936 B2 | 11/2003 | Hamamatsu et al. | |
| 6,660,561 B2 | 12/2003 | Forthun | |
| 6,661,092 B2 | 12/2003 | Shibata et al. | |
| 6,677,670 B2 | 1/2004 | Kondo | |
| 6,683,377 B1 | 1/2004 | Shim et al. | |
| 6,690,584 B2 | 2/2004 | Uzuka et al. | |
| 6,699,730 B2 | 3/2004 | Kim et al. | |
| 6,720,652 B2 | 4/2004 | Akram et al. | |
| 6,721,181 B1 | 4/2004 | Pfeifer et al. | |
| 6,721,185 B2 | 4/2004 | Dong et al. | |
| 6,721,226 B2 | 4/2004 | Woo et al. | |
| 6,744,656 B2 | 6/2004 | Sugano et al. | |
| 6,751,113 B2 | 6/2004 | Bhakta et al. | |
| 6,756,661 B2 | 6/2004 | Tsuneda et al. | |
| 6,760,220 B2 | 7/2004 | Canter et al. | |
| 6,762,942 B1 | 7/2004 | Smith | |
| 6,768,660 B2 | 7/2004 | Kong et al. | |
| 6,833,981 B2 | 12/2004 | Suwabe et al. | |
| 6,833,984 B1 | 12/2004 | Belgacem | |
| 6,839,266 B1 | 1/2005 | Garrett, Jr. et al. | |
| 6,841,868 B2 | 1/2005 | Akram et al. | |
| 6,850,414 B2 | 2/2005 | Benisek et al. | |
| 6,873,534 B2 | 3/2005 | Bhakta et al. | |
| 6,878,571 B2 | 4/2005 | Isaak et al. | |
| 6,884,653 B2 | 4/2005 | Larson | |
| 6,914,324 B2 | 7/2005 | Rapport et al. | |
| 6,919,626 B2 | 7/2005 | Burns | |
| 6,956,284 B2 | 10/2005 | Cady et al. | |
| 7,053,478 B2 | 5/2006 | Roper et al. | |
| 7,079,396 B2 * | 7/2006 | Gates et al. | 361/719 |
| 7,094,632 B2 | 8/2006 | Cady et al. | |
| 7,180,167 B2 | 2/2007 | Partridge et al. | |
| 7,324,352 B2 * | 1/2008 | Goodwin | 361/803 |
| 2001/0001085 A1 | 5/2001 | Hassanzadeh et al. | |
| 2001/0006252 A1 | 7/2001 | Kim et al. | |
| 2001/0013423 A1 | 8/2001 | Dalal et al. | |
| 2001/0015487 A1 | 8/2001 | Forthun | |
| 2001/0026008 A1 | 10/2001 | Tsuneda et al. | |
| 2001/0028588 A1 | 10/2001 | Yamada et al. | |
| 2001/0035572 A1 | 11/2001 | Isaak | |
| 2001/0040793 A1 | 11/2001 | Inaba | |
| 2001/0052637 A1 | 12/2001 | Akram et al. | |
| 2002/0001216 A1 | 1/2002 | Sugano et al. | |
| 2002/0006032 A1 | 1/2002 | Karabatsos | |
| 2002/0030995 A1 | 3/2002 | Shoji | |
| 2002/0076919 A1 | 6/2002 | Peters et al. | |
| 2002/0094603 A1 | 7/2002 | Isaak | |
| 2002/0101261 A1 | 8/2002 | Karabatsos | |
| 2002/0139577 A1 | 10/2002 | Miller | |
| 2002/0164838 A1 | 11/2002 | Moon et al. | |
| 2002/0180022 A1 | 12/2002 | Emoto | |
| 2002/0185731 A1 | 12/2002 | Akram et al. | |
| 2002/0196812 A1 | 12/2002 | Gall et al. | |
| 2003/0002262 A1 | 1/2003 | Benisek et al. | |
| 2003/0026155 A1 | 2/2003 | Yamagala | |
| 2003/0035328 A1 | 2/2003 | Hamamatsu et al. | |

| | | | |
|---|---|---|---|
| 2003/0045025 A1 | 3/2003 | Coyle et al. | |
| 2003/0049886 A1 | 3/2003 | Salmon | |
| 2003/0064548 A1 | 4/2003 | Isaak | |
| 2003/0081387 A1 | 5/2003 | Schulz | |
| 2003/0081392 A1 | 5/2003 | Cady et al. | |
| 2003/0089978 A1 | 5/2003 | Miyamoto et al. | |
| 2003/0090879 A1 | 5/2003 | Doblar et al. | |
| 2003/0096497 A1 | 5/2003 | Moore et al. | |
| 2003/0109078 A1 | 6/2003 | Takahashi et al. | |
| 2003/0116835 A1* | 6/2003 | Miyamoto et al. | 257/678 |
| 2003/0159278 A1 | 8/2003 | Peddle | |
| 2003/0168725 A1 | 9/2003 | Warner et al. | |
| 2004/0000708 A1 | 1/2004 | Rapport et al. | |
| 2004/0012991 A1 | 1/2004 | Kozaru | |
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1 | 11/2004 | Cady et al. | |
| 2004/0236877 A1 | 11/2004 | Burton | |
| 2004/0262737 A1* | 12/2004 | Haba | 257/692 |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0083043 A1* | 4/2006 | Cypher | 365/51 |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |

FOREIGN PATENT DOCUMENTS

| | | |
|---|---|---|
| EP | 0 298 211 A3 | 1/1989 |
| EP | 1 119043 A2 | 7/2001 |
| GB | 2 130 025 A | 5/1984 |
| JP | 53-85159 | 7/1978 |
| JP | 58-96756 A | 6/1983 |
| JP | 3-102862 | 4/1991 |
| JP | 5-29534 A | 2/1993 |
| JP | 5-335895 A | 12/1993 |
| JP | 2821315 B2 | 11/1998 |
| JP | 2001/077294 A | 3/2001 |
| JP | 2001/085592 A | 3/2001 |
| JP | 2001/332683 A | 11/2001 |
| JP | 2002/089231 A | 1/2002 |
| JP | 2003/037246 A | 2/2003 |
| JP | 2003/086760 A | 3/2003 |
| JP | 2003/086761 A | 3/2003 |
| JP | 2003/309246 A | 10/2003 |
| JP | 2003/347503 A | 12/2003 |
| WO | WO03/037053 | 5/2003 |
| WO | WO 03/037053 A1 | 5/2003 |
| WO | WO 2004/109602 A1 | 12/2004 |

OTHER PUBLICATIONS

Complaint filed Mar. 8, 2007, in the United States District Court for the District of Massachusetts, Boston Division, Civil Action No. 07 CA 10468 DPW.

Letter dated Sep. 11, 2006, from Chris Karabatsos of Kentron Technologies to John Kelly, President of JEDEC Solid State Technology Association, concerning potential interferences involving U.S. Appl. No. 11/306,803.

PCT/US05/28547 International Search Report and Written Opinion, PCT, Aug. 18, 2006.

PCT/US05/28547 Notification Concerning Transmittal of Copy of International Preliminary Report of Patentability, Mar. 15, 2007.

GB 0516622.8 Search Report, May 25, 2006.

PCT/US06/04690 International Search Report, PCT, Feb. 16, 2007.

PCT/US06/38720 International Search Report and Written Opinion, PCT, Apr. 5, 2007.

Pages 19-22 of Presentation by Netlist, Aug. 2004.

Flexible Printed Circuit Technology—A Versatile Interconnection Option. (Website 2 pages) Fjeistad, Joseph. Dec. 3, 2002.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

Tessera uZ Ball Stack Package, 4 figures that purport to be directed to the uZ—Ball Stacked Memory, Published on the Internet.

Chip Scale Review Online—An Independent Journal Dedicated to the Advancement of Chip-Scale Electronics. (Website 9 pages) Fjeistad, Joseph, Pacific Consultants L.L.C., Published Jan. 2001 on Internet.

Flexible Thinking: Examining the Flexible Circuit Tapes. (Website 2 pages) Fjeistad, Joseph.. Published Apr. 20, 2000 on Internet.

Ron Bauer, Intel. "Stacked-CSP Delivers Flexibility, Reliability, and Space-Saving Capabilities", vol. 3, Spring 2002. Published on the Internet.

Tessera Technologies, Inc.—Semiconductor Intellectual Property, Chip Scale Packaging—Website pages (3), Internet.

Tessera Introduces uZ ä—Ball Stacked Memory Package for Computing and Portable Electronic Products Joyce Smaragdis, Tessera Public Relations, Sandy Skees. MCA PR (www.tessera.com/news_events/press_coverage.cfm); 2 figures that purport to be directed to the uZ ä—Ball Stacked Memory Package. Published Jul. 17, 2002 in San Jose, CA.

William R. Newberry. Design Techniques for Ball Grid Arrays, Xynetix Design Systems, Inc., Portland, Maine, Published on the Internet.

Chip Scale Packaging and Redistribution, Paul A. Magill. Glenn A. Rinne, J. Daniel Mis, Wayne C Machos, Joseph W. Baggs. Unitive Electronics Inc.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512X16A3, Ceramic 512K X 16 CMOS SRAM Module.

IBM Preliminary 168 Pin SDRAM Registered DIMM Functional Description & Timing Diagrams.

3D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Integrated Package, Alvin Weinberg, Pacesetter, Inc. and W. Kinzy Jones, Florida International University.

PCT/US06/06921 International Search Report and Written Opinion, PCT, Jun. 1, 2007.

* cited by examiner

HIGH CAPACITY THIN MODULE SYSTEM

RELATED APPLICATIONS

This application is a continuation-in-part of Pat. App. No. PCT/US05/28547 filed Aug. 10, 2005, pending, and a continuation-in-part of U.S. patent application Ser. No. 11/068,688 filed Mar. 1, 2005, U.S. Pat. No. 7,324,352, which application is a continuation-in-part of U.S. patent application Ser. No. 11/007,551 filed Dec. 8, 2004, pending, which application is a continuation-in-part of U.S. patent application Ser. No. 10/934,027 filed Sep. 3, 2004, pending. This application is also a continuation-in-part of U.S. patent application Ser. No. 11/005,992 filed Dec. 7, 2004, pending, which application is a continuation-in-part of U.S. patent application Ser. No. 10/934,027 filed Sep. 3, 2004. This application is also a continuation-in-part of U.S. patent application Ser. No. 11/193,954 filed Jul. 29, 2005, pending, which application is a continuation-in-part of U.S. patent application Ser. No. 11/007,551 filed Dec. 8, 2004. This application is also a continuation-in-part of U.S. patent application Ser. No. 10/934,027 filed Sep. 3, 2004, pending. This application is also a continuation-in-part of U.S. patent application Ser. No. 11/123,721 filed May 6, 2005, pending, which application is a continuation-in-part of both U.S. patent application Ser. No. 11/068,688 filed Mar. 1, 2005 now U.S. Pat. No. 7,324,352 and U.S. patent application Ser. No. 11/005,992 filed Dec. 7, 2004.

Pat. App. No. PCT/US05/28547; U.S. patent application Ser. No. 10/934,027; U.S. patent application Ser. No. 11/068,688, now U.S. Pat. No. 7,324,352; U.S. patent application Ser. No. 11/005,992; U.S. patent application Ser. No. 11/193,954; U.S. patent application Ser. No. 11/123,721; and U.S. patent application Ser. No. 11/007,551 are each hereby incorporated by reference herein.

FIELD

The present invention relates to systems and methods for creating high density circuit modules and, in particular, to systems and methods for creating such modules with features directed to reducing concentration of thermal loading.

BACKGROUND

Memory expansion is one of the many fields where high density circuit module solutions provide space-saving advantages. For example, the well-known DIMM (Dual In-line Memory Module) has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Typically, systems that employ DIMMs provide limited profile space for such devices and conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be addressed per channel. With the DDR2-400 bus protocol, only 72 devices per channel may be addressed. This constraint has led to the development of the fully-buffered DIMM (FB-DIMM) with buffered C/A and data in which 288 devices per channel may be addressed. That buffering function is provided by what is typically identified as the Advanced Memory Buffer or AMB. With the FB-DIMM, not only has capacity increased, pin count has declined to approximately 69 signal pins from the approximately 240 pins previously required.

The FB-DIMM circuit solution is expected to offer practical motherboard memory capacities of up to about 192 gigabytes with six channels and eight DIMMs per channel and two ranks per DIMM using one gigabyte DRAMs. This solution should also be adaptable to next generation technologies and should exhibit significant downward compatibility.

There are several known methods to improve the limited capacity of a DIMM or other circuit board. In one strategy, for example, small circuit boards (daughter cards) are connected to the DIMM to provide extra mounting space. The additional connection may, however, cause flawed signal integrity for the data signals passing from the DIMM to the daughter card while the additional thickness of the daughter card(s) increases the profile of the module.

Multiple die packages (MDP) can also be used to increase DIMM capacity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another way to increase module capacity. Capacity is increased by stacking packaged integrated circuits to create a high-density circuit module for mounting on the larger circuit board. In some techniques, flexible conductors are used to selectively interconnect packaged integrated circuits. Staktek Group L.P. has developed numerous systems for aggregating CSP (chipscale packaged) devices in space saving topologies. The increased component height of some stacking techniques may, however, alter system requirements such as, for example, required cooling airflow or the minimum spacing around a circuit board on its host system.

Typically, the known methods for improved memory module performance or enlarged capacity raise thermal management issues. For example, when a conventional packaged DRAM is mounted on a DIMM, the primary thermal path is through the balls of the package into the core of a multilayer DIMM that has less than desirable thermal characteristics. In particular, when an advanced memory buffer (AMB) is employed in an FB-DIMM, a significant amount of heat is generated. Consequently, the already marginal thermal shedding attributes of DIMM circuit modules is exacerbated in a typical FB-DIMM by the localized generation of heat by the AMB.

What is needed, therefore, are methods and structures for providing high capacity circuit boards in thermally-efficient, reliable designs that perform well at higher frequencies but are not too large, yet can be made at reasonable cost with commonly available and readily managed materials.

SUMMARY

A flexible circuitry is populated with integrated circuitry (ICs) disposed along one or both of its major sides. Contacts are distributed along the flexible circuitry to provide connection between the module and an application environment. The populated flexible circuitry is disposed about an edge of a rigid substrate thus placing the integrated circuitry on one or both sides of the substrate with one or two layers of integrated circuitry on one or both sides of the substrate. The substrate form is preferably devised from thermally conductive materials and includes a high thermal conductivity thermal sink or area that is disposed proximal to higher thermal energy IC devices when the flex circuit is brought about the substrate. This allows thermal conductivity between the hot IC and the thermal sink.

The invention is particularly useful to disperse the thermal energy from hot circuitry such as, for example, AMBs employed with FB-DIMM circuitry mounted on the flexible circuitry. Other module variations may include thermally-conductive clips that thermally contact respective ICs on opposite sides of the module to further shunt heat from the ICs. In still other variations, no thermal sink is employed and the high heat device(s) mounted on the inner side of the flex circuitry is disposed in thermal contact with the substrate that is made from thermally conductive material. In preferred embodiments, extensions from the substrate body or substrate core encourage reduced thermal variations amongst the ICs of the module while providing an enlarged surface for radiation of thermal energy from the module.

DETAILED DESCRIPTION OF PREFERRED EMBODIMENTS

Figure 1:
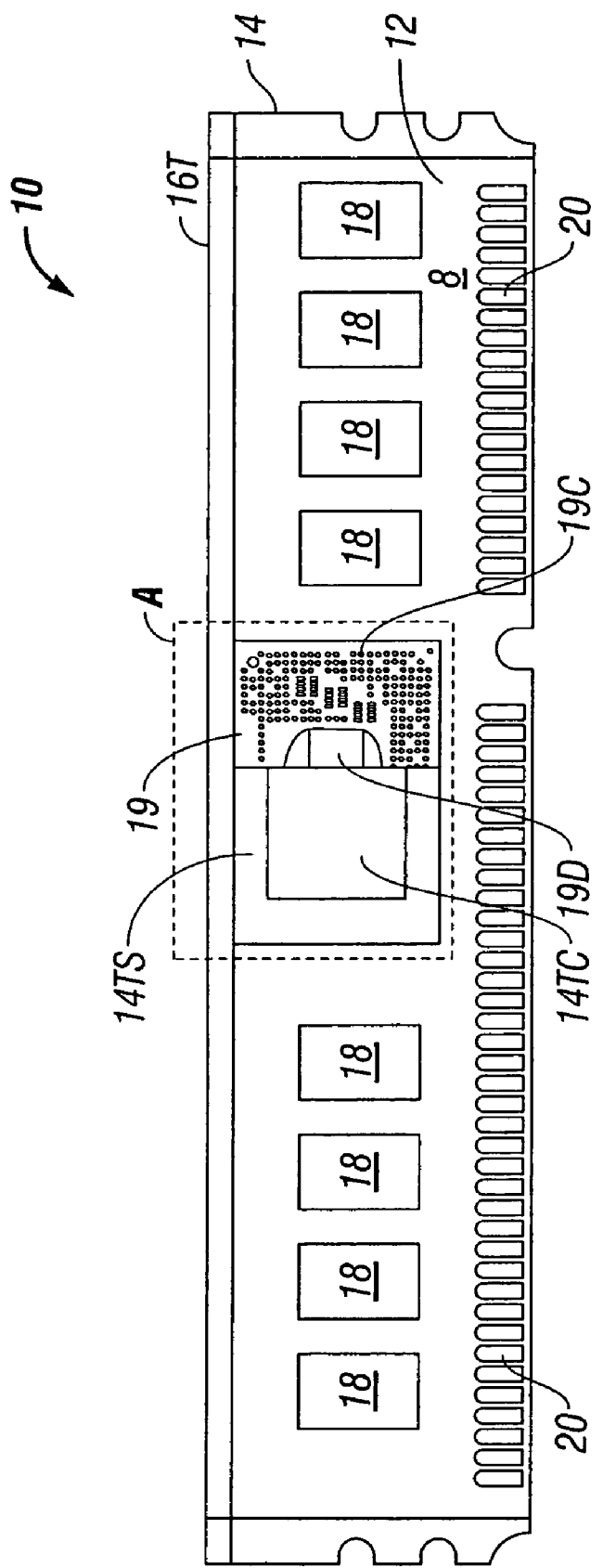
FIG. 1 depicts a module devised in accordance with a preferred embodiment of the present invention. Certain cutaway areas expose internal construction details.

FIG. 1 depicts a module 10 devised in accordance with a preferred embodiment of the present invention. The depiction of FIG. 1 illustrates module 10 having substrate 14 about which is disposed flex circuit 12 populated with ICs 18 which are, in a preferred embodiment, memory devices in CSP packages. Flex circuit 12 is cutaway in area "A" to illustrate internal preferred features of module 10. Area "A" is shown in greater enlargement in later FIG. 3.

Within area A are seen thermal sink 14TS and beyond the cutaway section of thermal sink 14TS, there is shown a part of a circuit 19 which, in a preferred embodiment, is the well-known advanced memory buffer or AMB employed in FB-DIMM circuitry. AMB circuit 19 includes AMB die 19D and contacts 19C. A module in accordance with a preferred embodiment typically will exhibit plural CSPs of a first type, such as memory CSPs, for example, and will have at least one CSP of a second type, such as a microprocessor, graphics processor or buffer or, more particularly, an AMB, for example.

Thermal sink 14TS is comprised, in this preferred embodiment, from metallic material of high thermal conductivity such as, for example, copper or copper alloy and has, in this preferred embodiment, a central portion 14TC that is a copper field substantially larger than and preferably in thermal contact with AMB die 19D either directly or through thermally-conductive adhesive or a thermally-conductive gasket material, for example. Thermal contact with a part of circuit 19 should be considered thermal contact with circuit 19.

In this preferred embodiment, central portion 14TC of thermal sink 14TS is raised above the periphery of thermal sink 14TS and additionally provides on its other side, an indentation into which may be introduced at least a portion of AMB circuit 19 such as, for example, AMB die 19D, to assist in realization of a low profile for module 10. An indentation is not required however to practice the invention. In the preferred depicted embodiment, thermal sink 14TS is disposed over a window 250 through substrate 14. AMB circuit 19, which is mounted on the "inside" of flex circuit 12, is disposed, at least in part, into window 250 from the "back" side of substrate 14 to realize thermal contact with thermal sink 14TS to provide a conduit to reduce thermal energy loading of AMB circuit 19.

Thermal sink 14TS need not cover the entirety of window 250. In other embodiments, for example, thermal sink 14TS may merely be across the window 250 or thermal sink 14TS may be set into window 250 instead of over or across the opening of window 250. Thermal sink 14TS is typically a separate piece of metal from substrate 14 but, after appreciating this specification, those of skill will recognize that, in alternative instances, thermal sink 14TS may be integral with substrate 14 or a particular portion of substrate 14 may be constructed to be a thermal sink 14TS in accordance with the teachings herein. For example, substrate 14 may be comprised of aluminum, while a thermal sink area 14TS of substrate 14 may be comprised of copper yet substrate 14 and thermal sink 14TS are of a single piece. In a variation of the integral thermal sink-substrate embodiment, the thermal sink could be attached to the substrate without a window and thus be preferentially accessible only on one side of substrate 14. Construction expense will be more likely to militate against such construction but the principles of the invention encompass such constructions. Consequently, a window in substrate 14 is not required to practice some embodiments of the invention. Therefore, a thermal sink 14TS should be considered to be an area or element integral with or attached to a substrate 14 and the material from which that thermal sink is composed exhibits greater thermal conductivity than the material of the substrate. To continue the example, substrate 14 may be aluminum while thermal sink 14TS is comprised of copper.

Figure 4A:
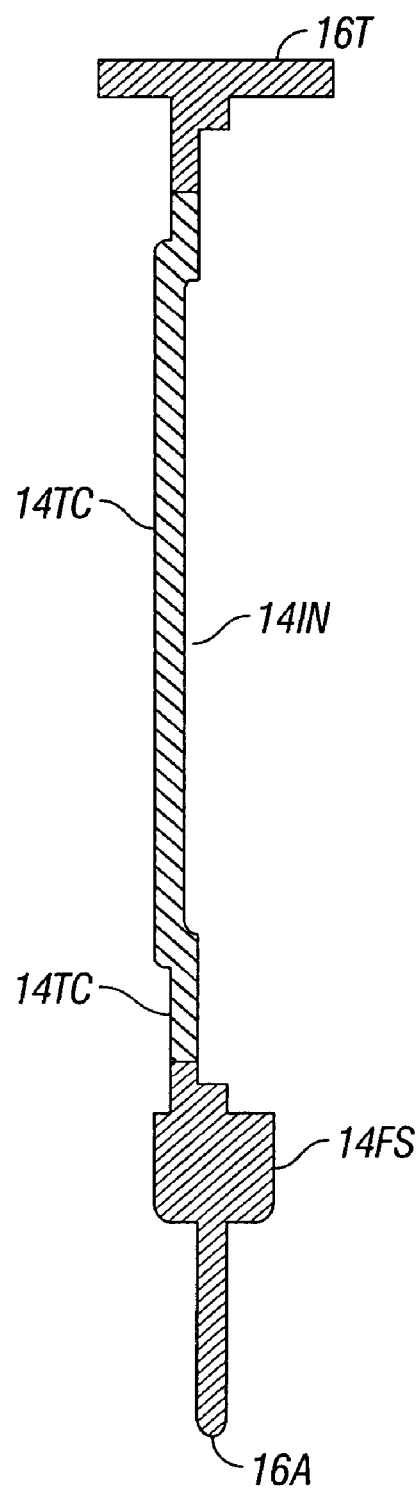
FIG. 4A illustrates a substrate employed in an alternative preferred embodiment of the present invention where a thermal sink is integral with the substrate.

In FIG. 4A a depicted substrate 14 is shown as having an integral thermal sink 14TS. The different materials used for the thermal sink 14TS as opposed to the substrate in general which result in the different thermal conductivity characteristics between substrate 14 and thermal sink 14TS are represented by the different hatching of the FIG. 4A. For example, thermal sink 14TS in this depiction may be copper, for example, while the main body of substrate 14 may be comprised of aluminum, to name just one example. Another example could be a plastic bodied substrate 14 and a copper based thermal sink 14TS. Flex support 14FS is also shown in FIG. 4A and is typically comprised of the same material as the bulk of substrate 14.

Figure 4B:
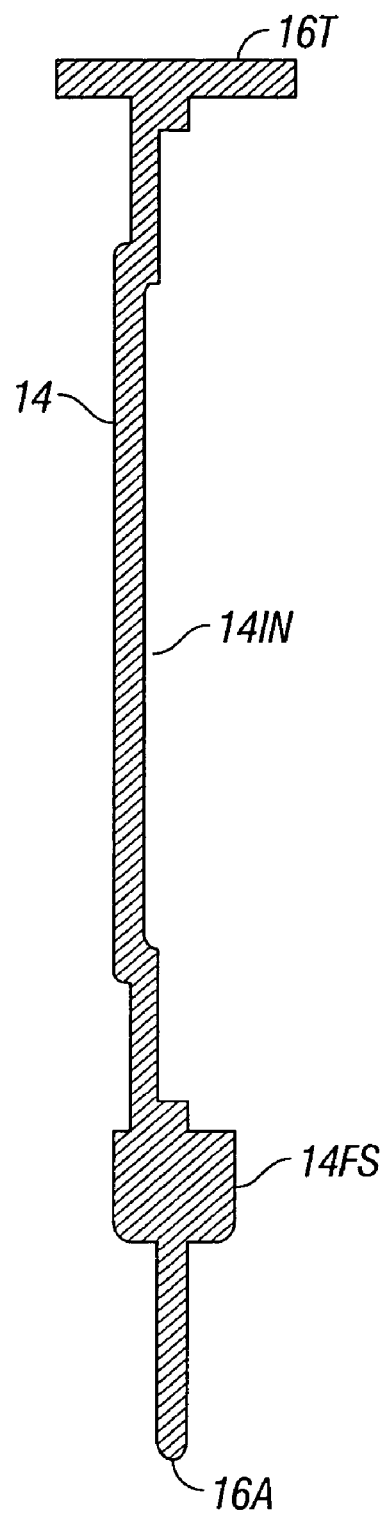
FIG. 4B illustrates a substrate employed with another alternative embodiment of the present invention in which an area of the substrate is deformed to provide an indentation.

Despite the advantages of using a thermal sink with module 10, for cost reasons, amongst other rationales, some may wish to construct modules similar to those with thermal sinks but lacking such a feature. In that case, FIG. 4B illustrates a substrate employed with another alternative embodiment of the present invention in which an area of the substrate is deformed to provide an indentation but no thermal sink 14TS is employed. Thus embodiments that employ substrates such as that depicted in FIG. 4B will not have a thermal sink but will rely on thermal contact between substrate 14 and circuit 19 to dissipate heat generated by circuit 19 where circuit 19 has been mounted on inner side 9 of flex circuit 12 as shown in later FIG. 7. As those of skill will note, indentation 14IN is not required.

Figure 5:
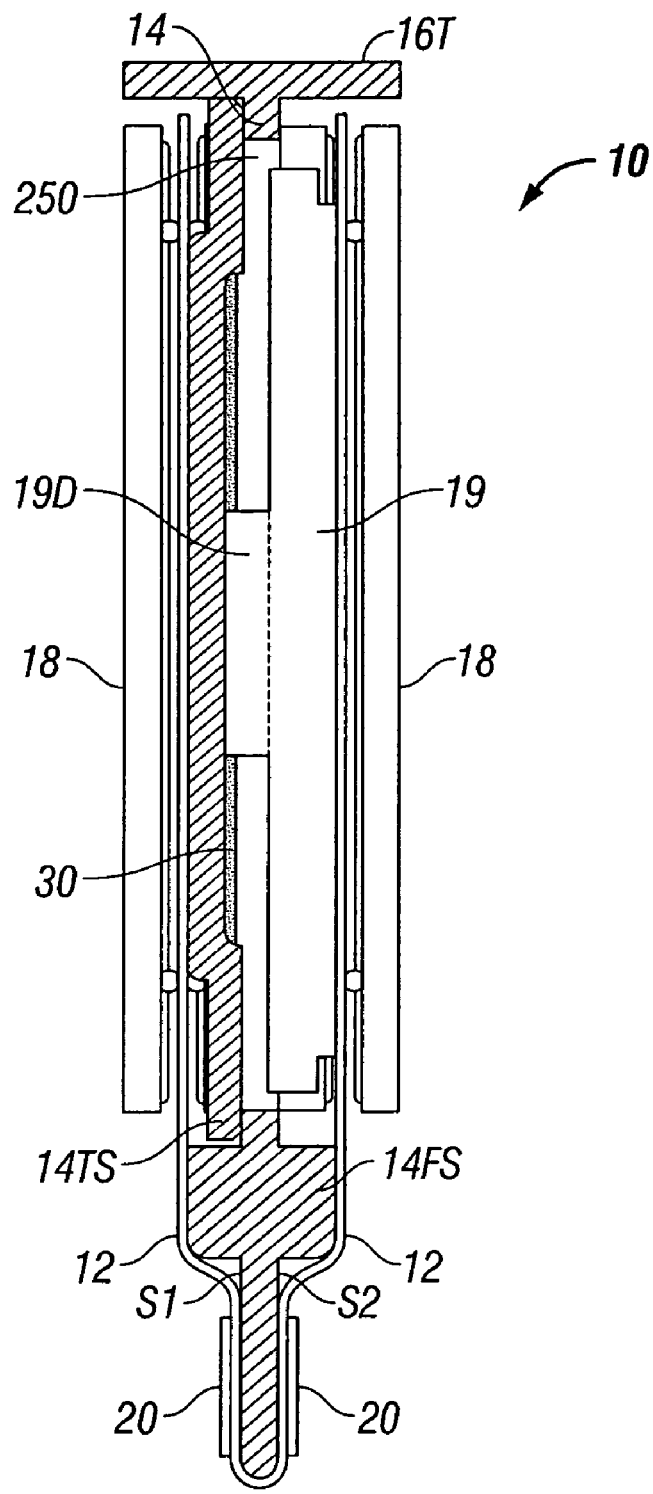
FIG. 5 is a cross-sectional view of a module devised in accordance with a preferred embodiment of the present invention.

Consequently, an exemplar embodiment that employed a substrate such as that shown in FIG. 4B and does not exhibit a thermal sink 1 4TS would look very much like the embodiment shown in FIG. 5 except that the structure labeled 14TS would not be separate from substrate 14 and would be a part of substrate 14 and composed from the same material. Further, no window 250 would be present since no opening in substrate 14 would be needed. Circuit 19 would be in thermal contact with substrate 14 rather than thermal sink 14TS.

Where a window 250 in substrate 250 is employed, at least a part of thermal sink 14TS should be accessible through window 250 from the "other" side of substrate 14. AMB circuit 19 or other high heat circuit 19 and, in particular, AMB die 19D, may be disposed in or across or over window 250 and preferably, will be introduced into an indentation of thermal sink 14TS and disposed in thermal contact with thermal sink 14TS and, more preferably, with the central core 14TC of thermal sink 14TS (where a central core has been optionally included in thermal sink 14TS) either with direct contact or through thermal adhesives or glues. Other embodiments may include additional windows where other high heat circuits are employed on module 10. Still other embodiments may insert some or all of ICs 18 into cutout areas in substrate 14 as described in detail in U.S. patent application Ser. No. 11/005, 992 which has been incorporated by reference herein.

In a preferred embodiment, thermal sink 14TS covers window 250 (as will be further illustrated in later FIG. 5) on one side of substrate 14 while AMB circuit 19 is disposed, at least in part, into window 250 to realize contact between thermal sink 14TS and AMB circuit 19 and particularly AMB die 19D either directly or as mediated through a thermally-conductive adhesive or glue.

Figure 2:
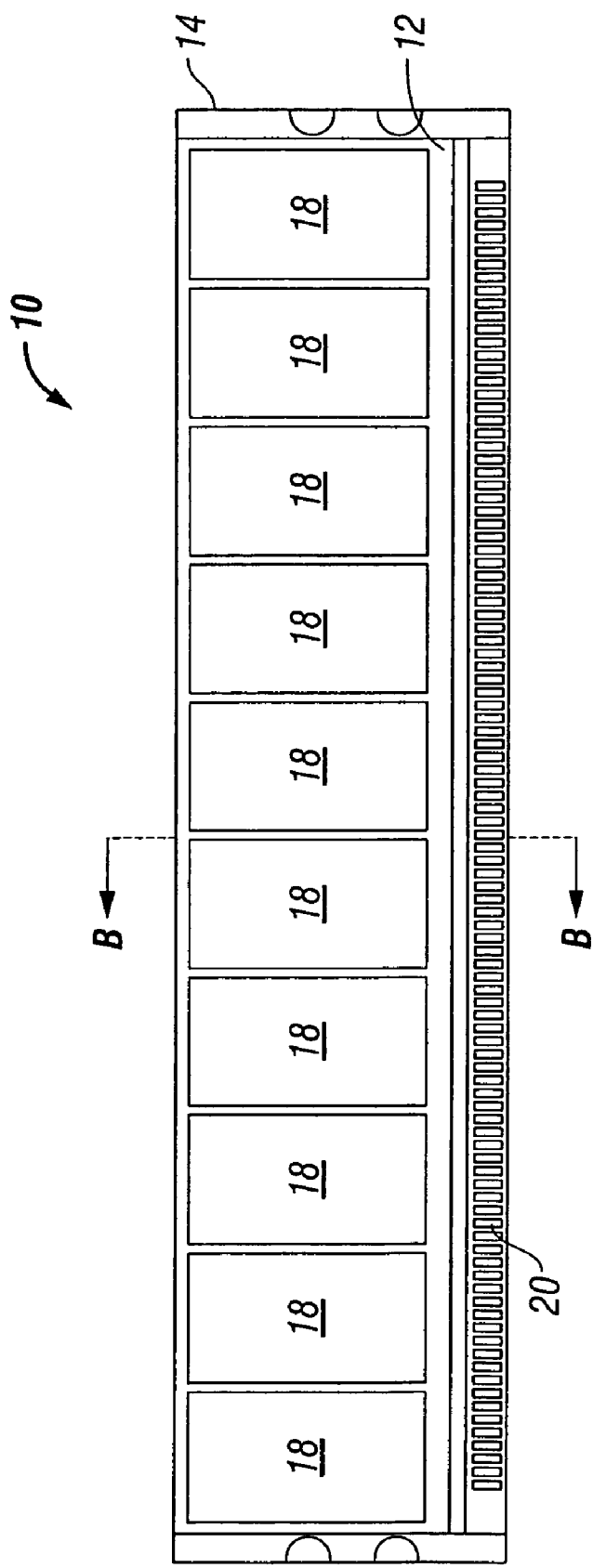
FIG. 2 is a plan view of a module devised in accordance with a preferred embodiment of the present invention.

FIG. 2 depicts module 10 with the aspect it would externally present without the cutaways of area "A" as exhibited in FIG. 1. As shown, module 10 will present an array of CSPs 18 along its exterior. Closer inspection of an actual preferred module 10 would reveal that CSPs that were populated along an inner side 9 of flex circuit 12 are now disposed proximal to substrate 14 on the inner portion of module 10.

Figure 3:
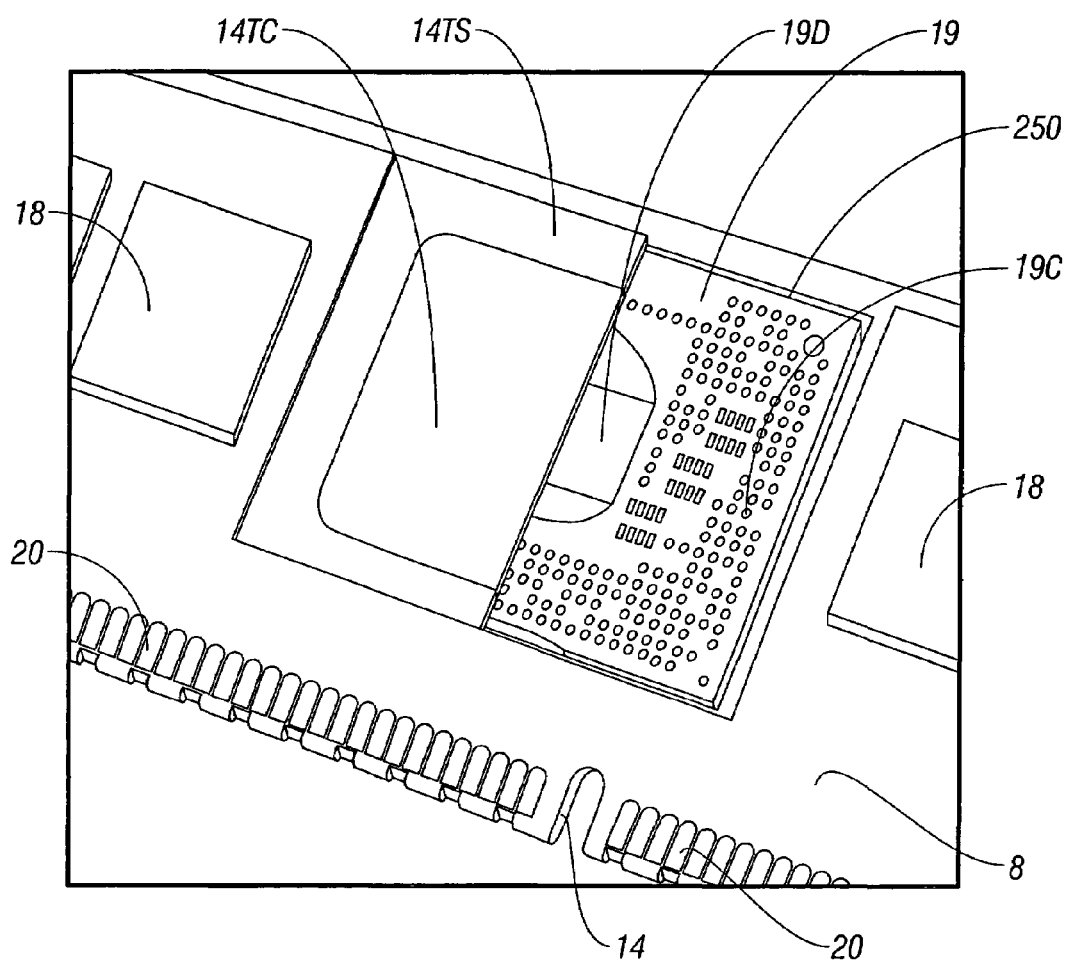
FIG. 3 is an enlarged depiction of the area marked "A" in FIG. 1.

FIG. 3 is an enlarged depiction of module 10 about the area marked "A" in FIG. 1. AMB circuit 19 is shown through window 250 through substrate 14. Preferably, AMB circuit 19 is mounted on what will become the internal side 9 of flex circuit 12 relative to module 10 and is, therefore, inserted into window 250 from the "rear" relative to the perspective shown in FIG. 3. Those of skill will recognize, particularly with reference to FIG. 3, that a portion of flex circuit 12 has been removed to expose thermal sink 14TS.

FIG. 4 depicts, in a cross-sectional view, an exemplar alternative substrate 14 that includes thermal sink 14TS having a central area 14TC as an integral part of substrate 14. As described earlier, with such an embodiment, there is no need for a window 250 in substrate 14 but construction complexity is likely to be minimized by use of a window in substrate 14.

As shown, central area 14TC of thermal sink 14TS is configured to exhibit an indentation area 14IN to provide space for a higher profile device such as, for example, a higher profile device such as AMB circuit 19. Indentation 14IN is a preferred, but not required, feature in both those embodiments where thermal sink 14TS is integral with substrate 14 as well as those embodiments where thermal sink 14TS is accessible through a window in substrate 14. Consequently, where indentation 14IN is present, at least a portion of AMB circuit 19 such as, for example, AMB die 19D will preferably be introduced into indentation 14IN when module 10 is assembled. Substrate 14 further exhibits optional extension 16T that provides thermal advantages for a preferred module 10. An extension 16T is preferred whether or not thermal sink 14TS is integral with substrate 14 or is made accessible through window 250 of substrate 14. Extension 16T may be devised in a variety of configurations and need not extend laterally from the main axis of substrate 14 in both directions. For example, extension 16T may extend from substrate 14 in only one direction and need not be directly perpendicular from the main body of substrate 14.

Preferably, substrate 14 is comprised of thermally conductive material. A metallic material with aluminum being readily manipulated for configuration as substrate 14 is a preferred choice. Materials such as FR4 may be employed, but other non-metallic materials that are thermally conductive are preferred over FR4. Carbon-based materials and certain plastics, for example, are known to readily conduct thermal energy and, as alternatives to metallic materials, such materials may be employed to advantage in preferred embodiments in accordance with the present invention where metallic materials are not available or wanted. Flex support 14FS is shown located near end 16A of substrate 14. Flex support 14FS provides physical support for flex circuit 12 when flex circuit 12 is disposed about end 16A. Flex support 14FS may be integral with or a separate piece from substrate 14.

FIG. 5 is a cross-sectional view of an exemplar module 10 taken along perspective line B-B of FIG. 2. FIG. 5 shows a substrate 14 with a window 250 through which thermal sink 14TS is accessible. Substrate 14 has first and second lateral sides identified as S1 and S2. Flex 12 is wrapped about perimeter edge 16A of substrate 14. As shown will be further shown in later FIG. 7, AMB circuit 19 is mounted on inner side 9 of flex circuit 12. When flex circuit 12 is disposed about substrate 14, AMB circuit 19 is introduced, at least in part, into window 250 with AMB die 19D extending further into said window 250 to realize thermal contact with thermal sink 14TS of substrate 14. That thermal contact is through thermally-conductive adhesive 30 but, in alternative embodiments, another preferred construction would place AMB die 19D in direct physical contact with thermal sink 14TS to realize the thermal contact between AMB circuit 19 and thermal sink 14TS. Other thermal conduction enhancing materials may also be used in place of or addition to thermal adhesive 30 such as for example, thermal grease or a thermal gasket.

Figure 6:
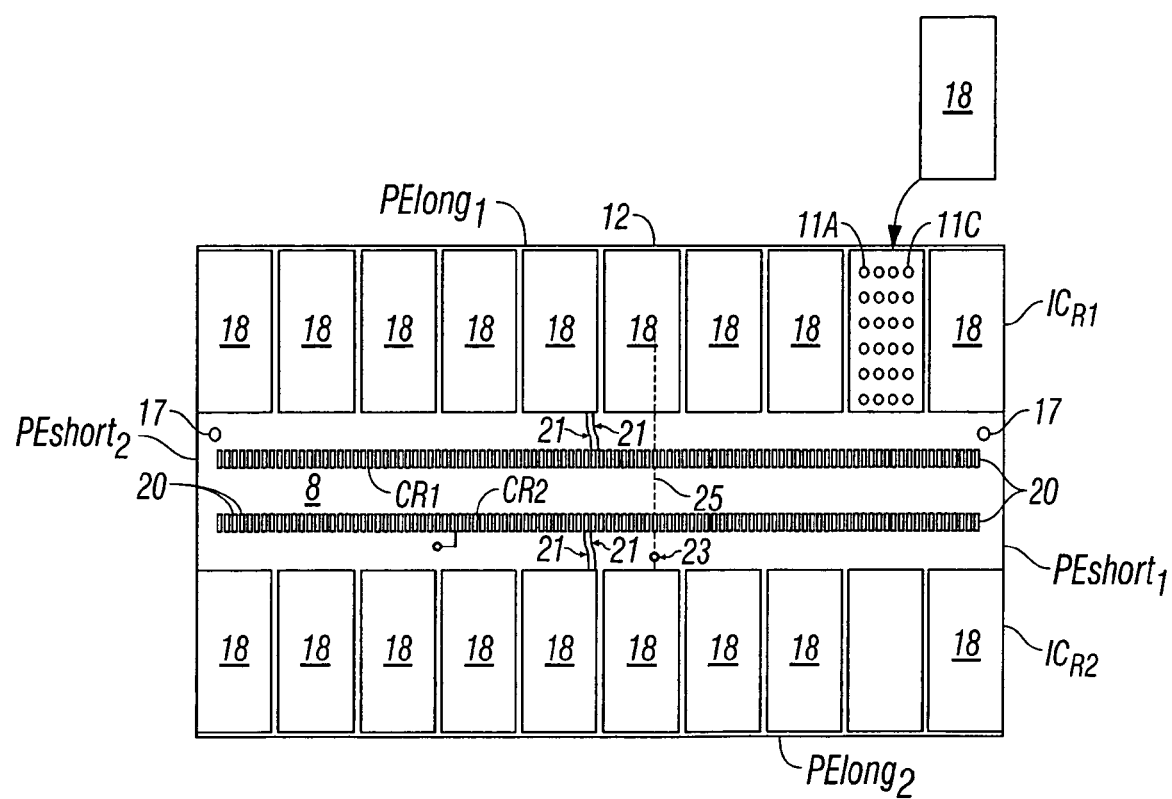
FIG. 6 depicts one side of a flex circuit employed in a preferred embodiment of the present invention.

FIG. 6 depicts a first side 8 of flex circuit 12 ("flex", "flex circuitry", "flexible circuit") used in constructing a module according to an embodiment of the present invention. Flex circuit 12 is preferably made from one or more conductive layers supported by one or more flexible substrate layers as further described with reference to later FIG. 12. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. Preferred flex circuit 12 has openings 17 for use in aligning flex circuit 12 to substrate 14 during assembly.

ICs 18 on flexible circuit 12 are, in this embodiment, chip-scale packaged memory devices of small scale. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar FIGS.

Multiple integrated circuit die may be included in a package depicted as a single IC 18. While in this embodiment memory ICs are used to provide a memory expansion board or module, and various embodiments may include a variety of integrated circuits and other components. Such variety may include microprocessors, FPGA's, RF transceiver circuitry, digital logic, as a list of non-limiting examples, or other circuits or systems which may benefit from a high-density circuit board or module capability. In some preferred embodiments, circuit 19 will be an AMB, but the principles of the invention may be employed with a variety of heat generating devices such as, for example, a microprocessor or graphics processor employed in a circuit module.

The depiction of FIG. 6 shows flex circuit 12 as having first and second fields of ICs 18 with one field of ICs 18 on each side of contacts 20. Those of skill will recognize that contacts 20 may appear on one or both sides of module 10 depending on the mechanical contact interface particulars of the application.

Flex circuit 12 may also referenced by its perimeter edges, two of which are typically long ($PE_{long1}$ and $PE_{long2}$) and two of which are typically shorter ($PE_{short1}$ and $PE_{short2}$) although flex circuit 12 may come in a variety of shapes including square. Contact arrays such as array 11A are disposed beneath ICs 18 and AMB circuit 19 and are comprised of array contacts 11C. An exemplar contact array 11A is shown as is exemplar IC 18 to be mounted at contact array 11A as depicted. The contact arrays 11A that correspond to an IC plurality may be considered a contact array set.

A first plurality of ICs 18 is shown on side 8 of flex circuit 12 and is identified as $IC_{R1}$ and a second plurality of CSPs is identified as $IC_{R2}$. Those of skill will recognize that the identified pluralities of CSPs are, when disposed in the configurations depicted, typically described as "ranks". Between the ranks $IC_{R2}$ and $IC_{R2}$, flex circuit 12 bears a plurality of module contacts allocated in this embodiment into two rows ($C_{R1}$ and $C_{R2}$) of module contacts 20. When flex circuit 12 is folded about substrate 14 as earlier depicted in, for example, FIG. 5, side 8 depicted in FIG. 6 is presented at the outside of module 10 and will be seen in views that correspond to FIG. 2. The opposing side 9 of flex circuit 12 is on the inside in several depicted configurations of module 10 and thus side 9 is closer to the substrate 14 about which flex circuit 12 is disposed than is side 8. Other embodiments may have other numbers of ranks and combinations of plural CSPs connected to create the module of the present invention.

FIG. 6 depicts an exemplar conductive trace 21 connecting row CR2 of module contacts 20 to ICs 18. Those of skill will understand that there are many such traces in a typical embodiment. Traces 21 may also connect to vias that may transit to other conductive layers of flex 12 in certain embodiments having more than one conductive layer. In a preferred embodiment, vias connect ICs 18 on side 9 of flex 12 to module contacts 20. An example via is shown as reference 23. Traces 21 may make other connections between the ICs on either side of flex 12 and may traverse the rows of module contacts 20 to interconnect ICs. Together the various traces and vias make interconnections needed to convey data and control signals amongst the various ICs and buffer circuits. Those of skill will understand that the present invention may be implemented with only a single row of module contacts 20 and may, in other embodiments, be implemented as a module bearing ICs on only one side of flex circuit 12.

Figure 7:
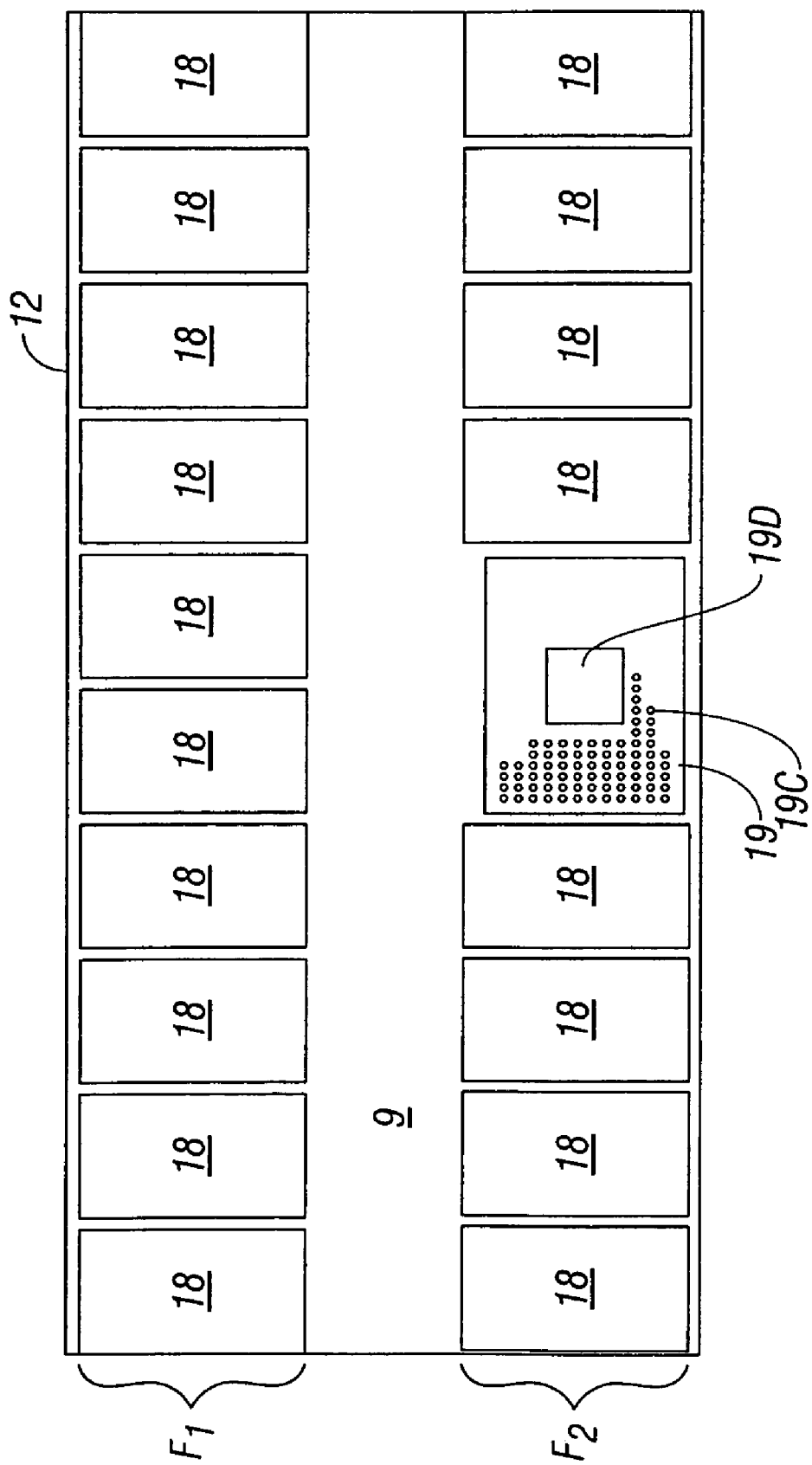
FIG. 7 depicts another side of the flex circuit depicted in FIG. 6.

FIG. 7 shows side 9 of flex circuit 12 depicting the other side of the flex circuit shown in FIG. 6. Side 9 of flex circuit 12 is shown as being populated with multiple CSPs 18 and AMB circuit 19. Side 9 includes fields F1 and F2 that each include at least one mounting contact array site for CSPs and, in the depicted case, include multiple contact arrays. Each of fields F1 and F2 include, in the depicted preferred embodiment, two pluralities of ICs identified in earlier FIG. 6 as $IC_{R1}$ and $IC_{R2}$.

Various discrete components such as termination resistors, bypass capacitors, and bias resistors may be mounted on either or both of sides 8 and 9 of flex 12. Such discrete components are not shown to simplify the drawing. Other embodiments may also have fewer or greater numbers of ranks or pluralities of ICs in each field or on a side of a flex circuit.

Figure 8:
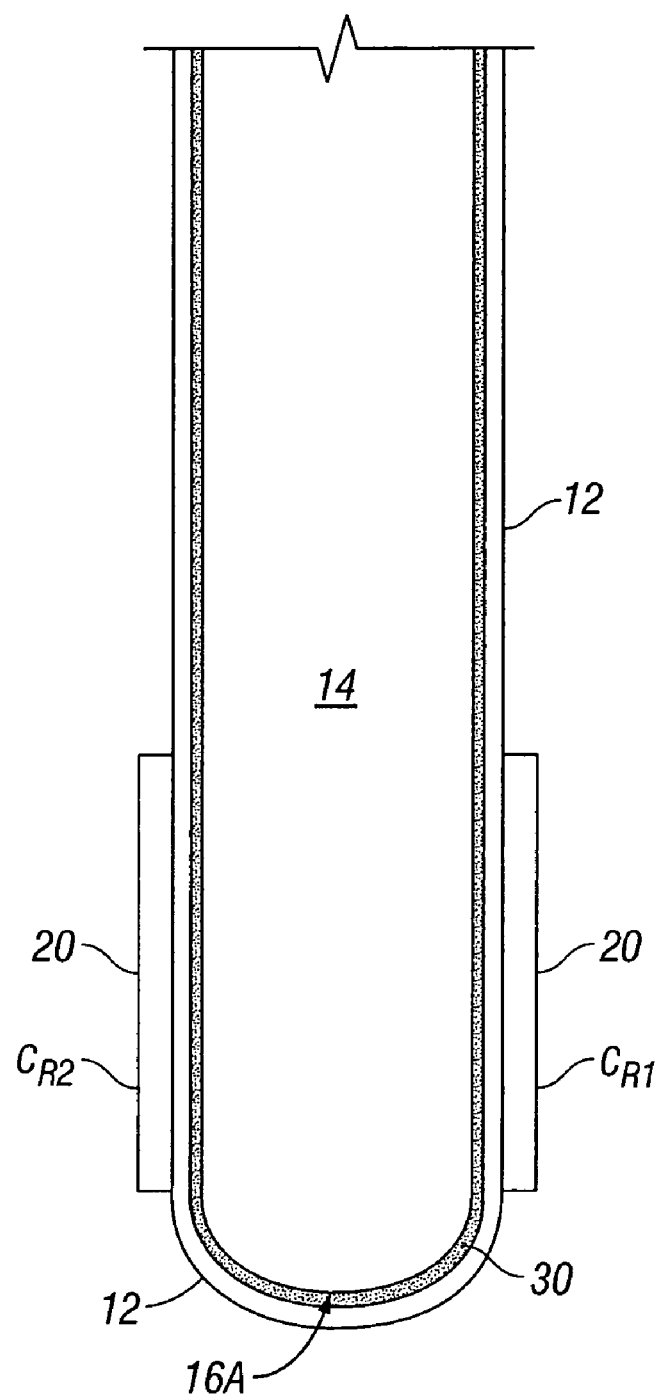
FIG. 8 depicts an exemplar end of a module devised in accordance with a preferred embodiment of the present invention.

FIG. 8 depicts an enlarged view of the area near end or edge 16A of an exemplar module 10. While a rounded configuration is shown, edge 16A may take on other shapes devised to mate with various connectors or sockets. The form and function of various edge card connectors are well know in the art. In many preferred embodiments, flex 12 is wrapped around edge 16A of substrate 14 and may be laminated or adhesively connected to substrate 14 with adhesive 30. The depicted adhesive 30 and flex 12 may vary in thickness and are not drawn to scale to simplify the drawing. The depicted substrate 14 has a thickness such that when assembled with the flex 12 and adhesive 30, the thickness measured between module contacts 20 falls in the range specified for the mating connector. In some other embodiments, flex circuit 12 may be implemented with two flex circuits 12A and 12B instead of one wrapped about end 16A. For example, a flex circuit 12A may be disposed on one side of module 10 while another flex circuit 12B may be disposed on another side of module 10. Adhesive 30 is employed to attached flex circuit 12 to substrate 14 and contacts 20 are disposed on each side of module 10. In other embodiments, contacts 20 need not be on both sides of module 10 and may be exhibited on only one side in configurations.

Figure 9:
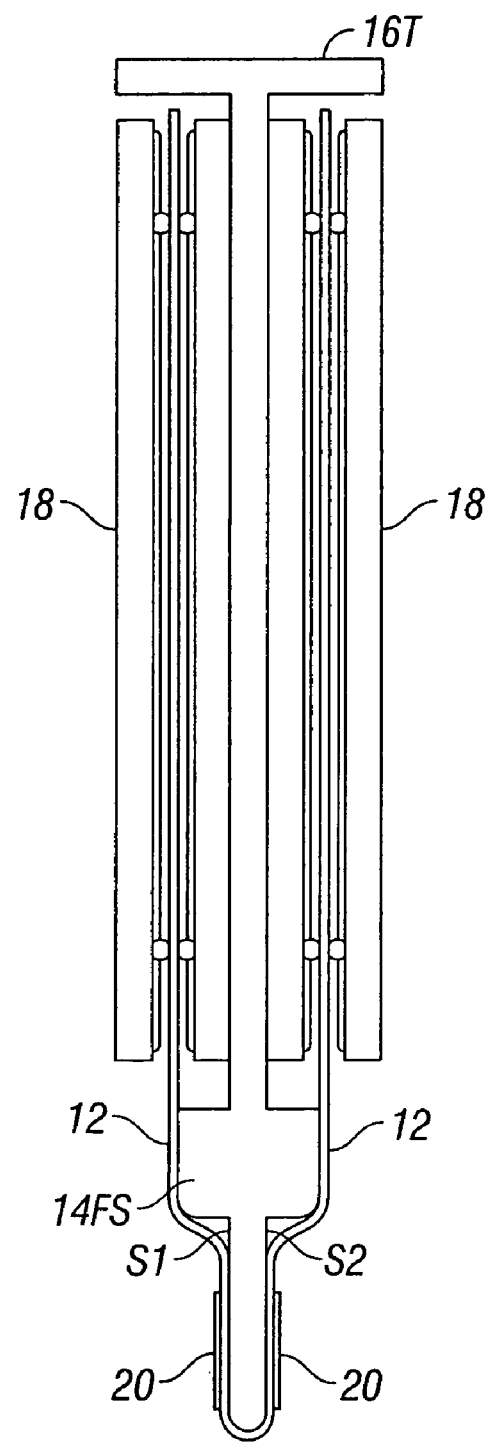
FIG. 9 is a cross-sectional view taken along a line through CSPs in a preferred embodiment of the present invention.

FIG. 9 is a cross section view of a module 10 devised in accordance with a preferred embodiment of the present invention. This cross-section is taken through module 10 at a point removed from circuit 19 so that the devices seen in cross section are ICs 18.

Figure 10:
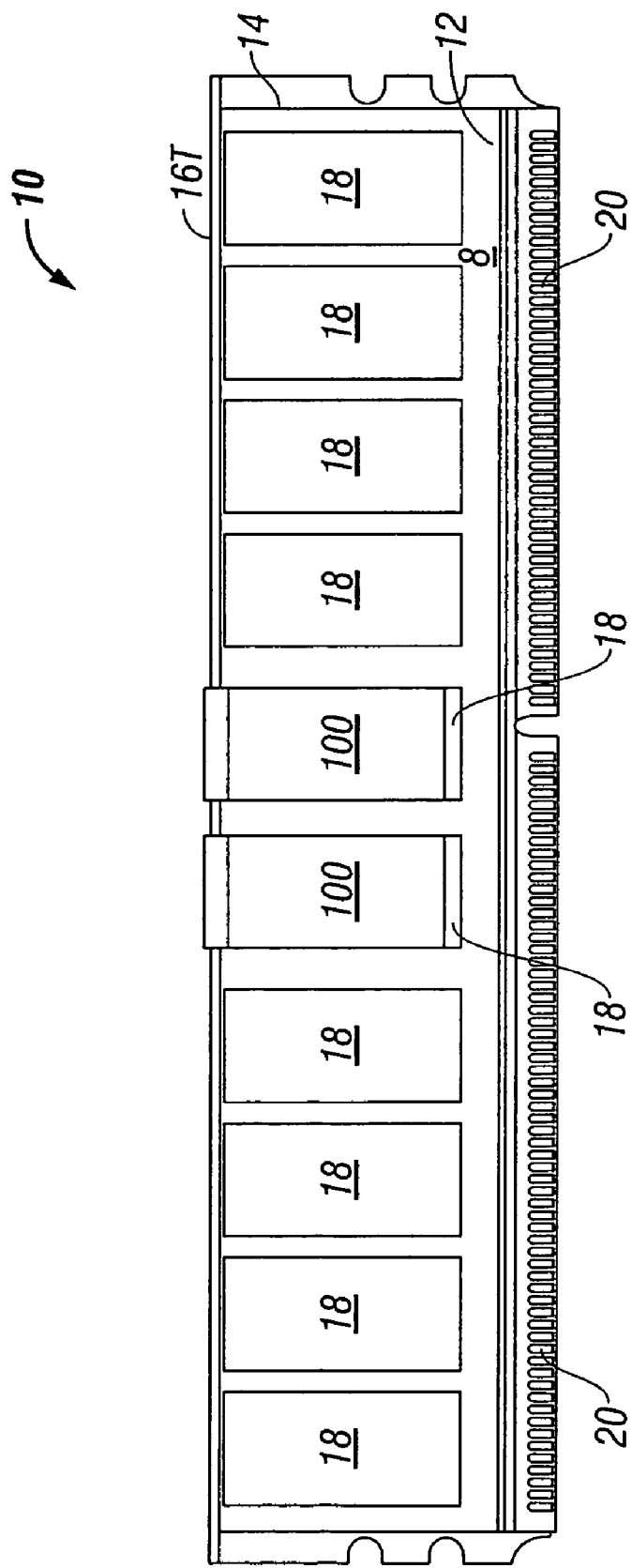
FIG. 10 is a plan view of a module devised in accordance with an alternative embodiment of the present invention.

FIG. 10 is a plan view of an alternative embodiment of the present invention that employs plural thermal or radiating clips 100 to assist in thermal management of module 10. Although only two such clips 100 are shown, it should be recognized that any number of such clips may be employed. Clips 100 are preferably comprised of thermally-conductive material and are in thermal contact with ICs 18 or a circuit 19, where a circuit 19 is disposed on the external part of a module 10. Preferably, a single clip 100 is in thermal contact with two CSPs, one on each side of module 10. The thermal contact between clips 100 and ICs 18 or 19 is either realized or enhanced with thermal grease 102 and preferably, clips 100 are devised in a configuration that presents an appreciable surface for thermal transfer.

Figure 11:
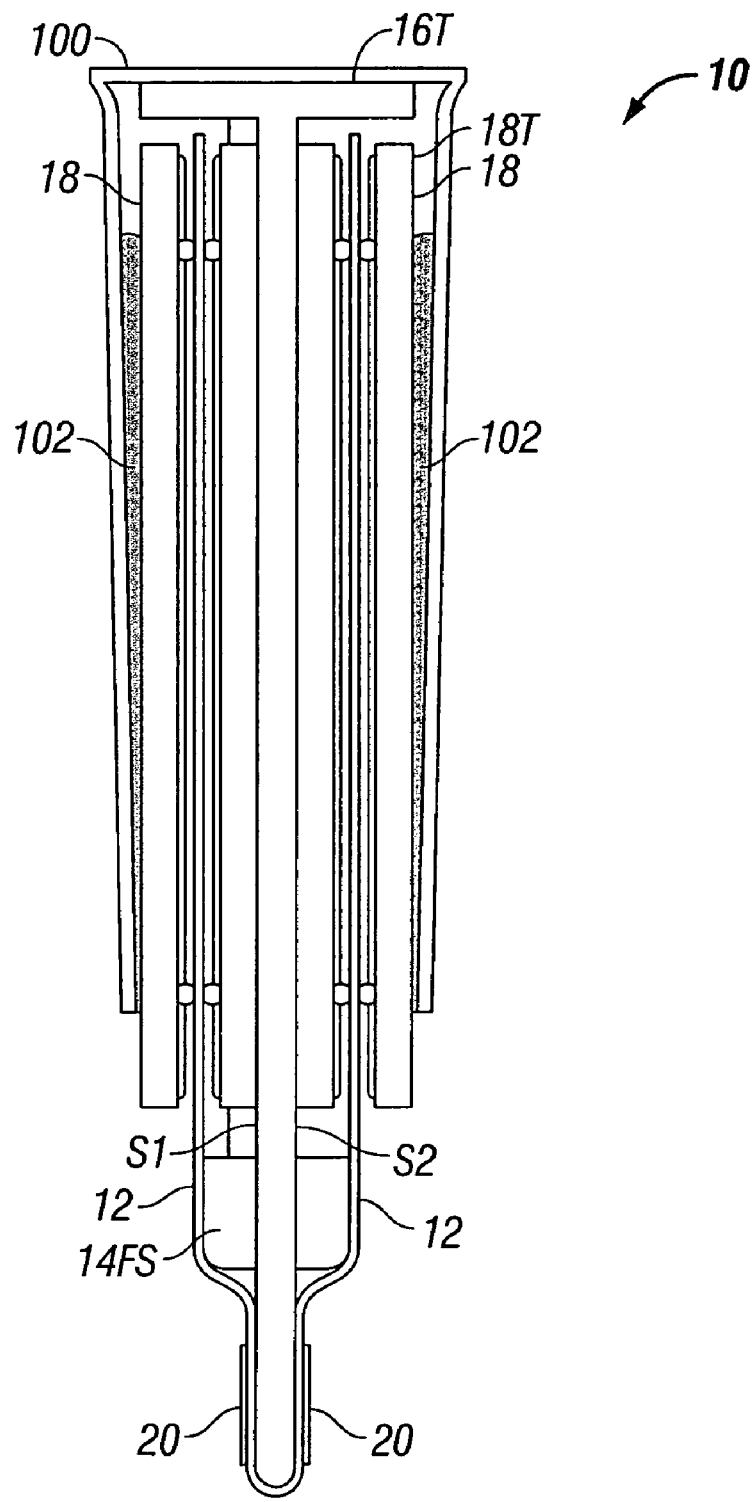
FIG. 11 is a cross-sectional view of the module depicted in FIG. 10.

FIG. 11 is a cross-sectional view of an exemplar module 10 fitted with at least one thermal or radiating clip 100. As shown, clip 100 is in thermal contact with ICs 18. That thermal contact is encouraged with thermal grease 102. It should be noted that thermal grease 102 is optional, but preferred. Depicted clip 100 transits over and is in contact with extension 16T to further increase thermal dissipation from module 10.

Figure 12:
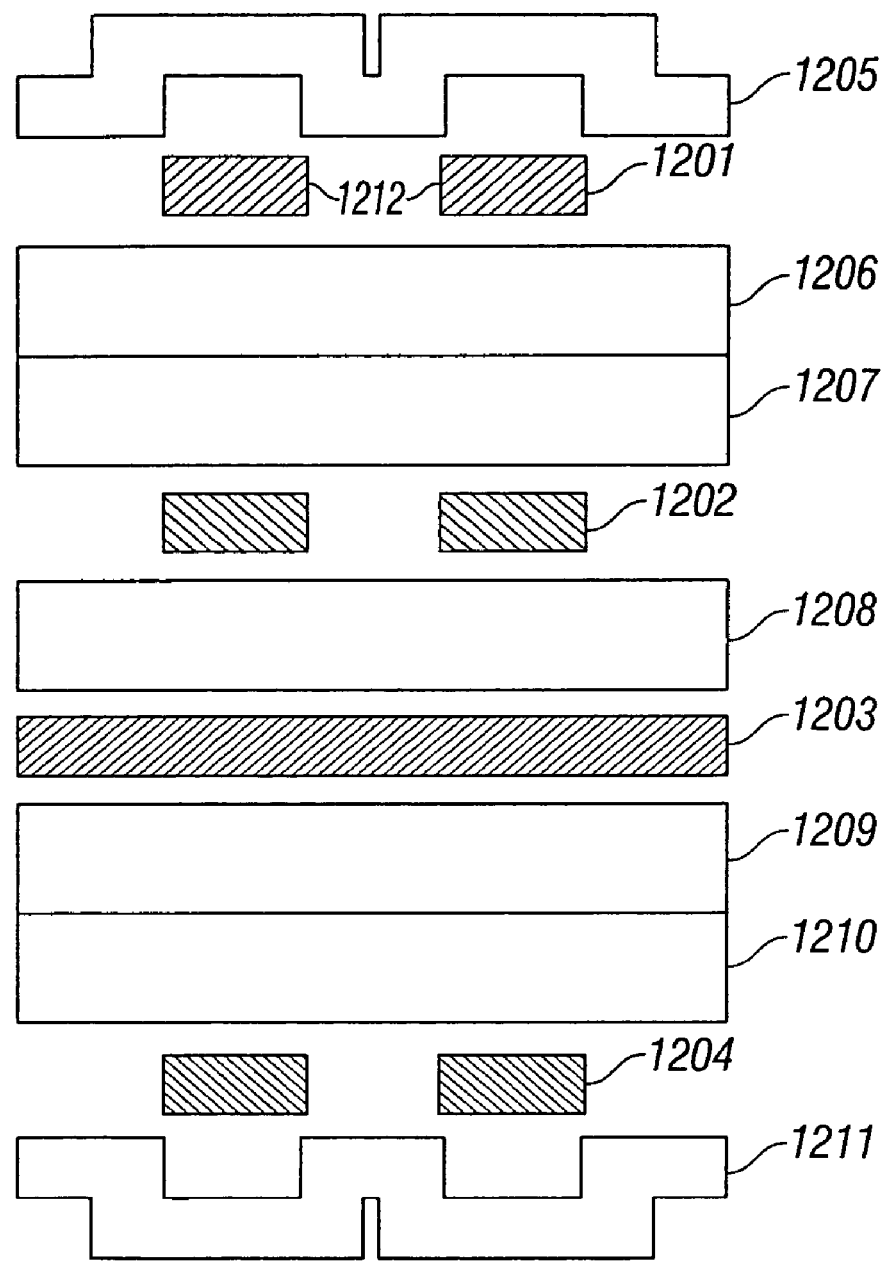
FIG. 12 is a cross-sectional view of a flex circuit employed in a preferred embodiment of the present invention.

FIG. 12 is an exploded depiction of a flex circuit 12 cross-section according to one preferred embodiment of the present invention. The depicted flex circuit 12 has four conductive layers 1201-1204 and seven insulative layers 1205-1211. The numbers of layers described are merely those used in one preferred embodiment and other numbers of layers and arrangements of layers may be employed. Even a single conductive layer flex circuit 12 may be employed in some embodiments, but flex circuits with more than one conductive layer prove to be more adaptable to more complex embodiments of the invention.

Top conductive layer 1201 and the other conductive layers are preferably made of a conductive metal such as, for example, copper or alloy 110. In this arrangement, conductive layers 1201, 1202, and 1204 express signal traces 1212 that make various connections by use of flex circuit 12. These layers may also express conductive planes for ground, power or reference voltages.

In this embodiment, inner conductive layer 1202 expresses traces connecting to and among various ICs. The function of any one of the depicted conductive layers may be interchanged in function with others of the conductive layers. Inner conductive layer 1203 expresses a ground plane, which may be split to provide VDD return for pre-register address signals. Inner conductive layer 1203 may further express other planes and traces. In this embodiment, floods or planes at bottom conductive layer 1204 provides VREF and ground in addition to the depicted traces.

Insulative layers 1205 and 1211 are, in this embodiment, dielectric solder mask layers which may be deposited on the adjacent conductive layers for example. Other embodiments may not have such adhesive dielectric layers. Insulating layers 1206, 1208, and 1210 are preferably flexible dielectric substrate layers made of polyimide. However, any suitable flexible circuitry may be employed in the present invention and the depiction of FIG. 12 should be understood to be merely exemplary of one of the more complex flexible circuit structures that may be employed as flex circuit 12.

The present invention may be employed to advantage in a variety of applications and environment such as, for example, in computers such as servers and notebook computers by being placed in motherboard expansion slots to provide enhanced memory capacity while utilizing fewer sockets. The two high rank embodiments or the single rank high embodiments may both be employed to such advantage as those of skill will recognize after appreciating this specification.

One advantageous methodology for efficiently assembling a circuit module 10 such as described and depicted herein is as follows. In a preferred method of assembling a preferred module assembly 10, flex circuit 12 is placed flat and both sides populated according to circuit board assembly techniques known in the art. Flex circuit 12 is then folded about end 16A of substrate 14. Flex 12 may be laminated or otherwise attached to substrate 14.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module comprising:
   (a) a rigid substrate having two opposing lateral sides and an edge and a thermal sink accessible on at least one of the two opposing lateral sides of the substrate; and
   (b) a flex circuit having first and second sides, the first side of the flex circuit having plural contacts adapted for connection to a circuit board socket and at least one of the first and second sides of the flex circuit being populated with plural memory CSPs with the second major side of the flex circuit being populated with an AMB, the flex circuit being disposed about the edge of the rigid substrate to dispose the AMB in thermal contact with the thermal sink, wherein the thermal sink being located between the rigid substrate and the flex circuit.

2. The circuit module of claim 1 in which the rigid substrate is comprised of thermally conductive material.

3. The circuit module of claim 1 or 2 in which the rigid substrate is comprised of aluminum.

4. The circuit module of claim 2 or 3 in which the substrate exhibits at least one extension.

5. The circuit module of claim 1, 2, or 3 in which at least a portion of the thermal sink provides an indentation into which, at least in part, a portion of the AMB is introduced.

6. The circuit module of claims 1, 2, 3, 4, or 5 in which the thermal contact is realized through thermally conductive adhesive.

7. The circuit module of claim 1 in which the first and second sides of the flex circuit are populated with plural memory CSPs.

8. The circuit module of claim 1 in which the rigid substrate further comprises a flex support.

9. The circuit module of claim 1 in which the thermal sink is comprised of copper.

10. The circuit module of claim 1 in which the thermal sink is comprised of non-metallic material that is thermally-conductive.

11. The circuit module of claim 1 or 3 in which the rigid substrate exhibits a window through which the thermal sink is accessible.

12. The circuit module of claim 1 in which the thermal sink across a window of the rigid substrate.

13. The circuit module of claim 1 in which the thermal sink covers a window of the rigid substrate.

* * * * *

UNITED STATES PATENT AND TRADEMARK OFFICE
CERTIFICATE OF CORRECTION

PATENT NO. : 7,443,023 B2  Page 1 of 1
APPLICATION NO. : 11/231418
DATED : October 28, 2008
INVENTOR(S) : James Douglas Wehrly, Jr. et al.

It is certified that error appears in the above-identified patent and that said Letters Patent is hereby corrected as shown below:

Col. 10 lines 47/48 after "in which the" delete "rigid substrate is comprised of aluminum." and insert -- substrate exhibits at least one extension. --, therefore.

Col. 10 lines 49/50 after "in which the" delete "substrate exhibits at least one extension." and insert -- rigid substrate is comprised of aluminum. --, therefore.

Col. 11 line 5 before "across" insert -- is --.

Signed and Sealed this

Sixth Day of January, 2009

JON W. DUDAS
*Director of the United States Patent and Trademark Office*